United States Patent
Wang et al.

(10) Patent No.: US 9,159,798 B2
(45) Date of Patent: Oct. 13, 2015

(54) REPLACEMENT GATE PROCESS AND DEVICE MANUFACTURED USING THE SAME

(71) Applicant: UNITED MICROELECTRONICS CORP., Hsinchu (TW)

(72) Inventors: Jun-Jie Wang, Changhua County (TW); Po-Chao Tsao, New Taipei (TW); Chia-Jui Liang, Tainan (TW); Shih-Fang Tzou, Tainan (TW); Chien-Ting Lin, Hsinchu (TW); Cheng-Guo Chen, Changhua County (TW); Ssu-I Fu, Kaohsiung (TW); Yu-Hsiang Hung, Tainan (TW); Chung-Fu Chang, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 132 days.

(21) Appl. No.: 13/886,382

(22) Filed: May 3, 2013

(65) Prior Publication Data
US 2014/0327055 A1 Nov. 6, 2014

(51) Int. Cl.
*H01L 21/8238* (2006.01)
*H01L 29/49* (2006.01)
*H01L 29/51* (2006.01)
*H01L 29/66* (2006.01)

(52) U.S. Cl.
CPC .............. *H01L 29/4966* (2013.01); *H01L 29/51* (2013.01); *H01L 29/66545* (2013.01); *H01L 29/66628* (2013.01)

(58) Field of Classification Search
CPC ..................... H01L 21/28008; H01L 2924/00; H01L 29/402; H01L 29/78; H01L 29/407
USPC ................................... 438/197, 585; 257/288
See application file for complete search history.

(56) References Cited

U.S. PATENT DOCUMENTS

| | | |
|---|---|---|
| 5,892,282 A | 4/1999 | Hong |
| 6,033,963 A | 3/2000 | Huang |
| 6,066,533 A | 5/2000 | Yu |
| 6,096,659 A | 8/2000 | Gardner |
| 6,177,303 B1 | 1/2001 | Schmitz |
| 6,303,418 B1 | 10/2001 | Cha |
| 6,458,684 B1 | 10/2002 | Guo |
| 6,492,217 B1 | 12/2002 | Bai |
| 6,552,377 B1 | 4/2003 | Yu |
| 6,573,134 B2 | 6/2003 | Ma |
| 6,653,698 B2 | 11/2003 | Lee |
| 6,696,345 B2 | 2/2004 | Chau |
| 6,790,719 B1 | 9/2004 | Adetutu |
| 6,794,234 B2 | 9/2004 | Polishchuk |

(Continued)

OTHER PUBLICATIONS

U.S. Appl. No. 13/728,611, filed Dec. 27, 2012.

*Primary Examiner* — Andy Huynh
(74) *Attorney, Agent, or Firm* — WPAT, PC; Justin King (57) ABSTRACT

A replacement gate process is disclosed. A substrate and a dummy gate structure formed on the substrate is provided, wherein the dummy gate structure comprises a dummy layer on the substrate, a hard mask layer on the dummy layer, spacers at two sides of the dummy layer and the hard mask layer, and a contact etch stop layer (CESL) covering the substrate, the spacers and the hard mask layer. The spacers and the CESL are made of the same material. Then, a top portion of the CESL is removed to expose the hard mask layer. Next, the hard mask layer is removed. Afterward, the dummy layer is removed to form a trench.

13 Claims, 6 Drawing Sheets

(56) References Cited

U.S. PATENT DOCUMENTS

| | | |
|---|---|---|
| 6,858,483 B2 | 2/2005 | Doczy |
| 6,902,969 B2 | 6/2005 | Adetutu |
| 6,921,711 B2 | 7/2005 | Cabral, Jr. |
| 6,953,719 B2 | 10/2005 | Doczy |
| 6,960,416 B2 | 11/2005 | Mui |
| 6,967,131 B2 | 11/2005 | Saenger |
| 6,972,225 B2 | 12/2005 | Doczy |
| 7,029,966 B2 | 4/2006 | Amos |
| 7,030,430 B2 | 4/2006 | Doczy |
| 7,056,794 B2 | 6/2006 | Ku |
| 7,064,050 B2 | 6/2006 | Cabral, Jr. |
| 7,064,066 B1 | 6/2006 | Metz |
| 7,074,664 B1 | 7/2006 | White |
| 7,074,680 B2 | 7/2006 | Doczy |
| 7,109,079 B2 | 9/2006 | Schaeffer, III |
| 7,112,851 B2 | 9/2006 | Saenger |
| 7,126,199 B2 | 10/2006 | Doczy |
| 7,144,783 B2 | 12/2006 | Datta |
| 7,148,548 B2 | 12/2006 | Doczy |
| 7,153,734 B2 | 12/2006 | Brask |
| 7,153,784 B2 | 12/2006 | Brask |
| 7,157,378 B2 | 1/2007 | Brask |
| 7,176,090 B2 | 2/2007 | Brask |
| 7,183,184 B2 | 2/2007 | Doczy |
| 7,186,605 B2 | 3/2007 | Cheng |
| 7,193,893 B2 | 3/2007 | Forbes |
| 7,208,361 B2 | 4/2007 | Shah |
| 7,208,366 B2 | 4/2007 | Tsai |
| 7,217,611 B2 | 5/2007 | Kavalieros |
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,381,619 B2 | 6/2008 | Wang |
| 7,390,709 B2 | 6/2008 | Doczy |
| 7,407,876 B2 | 8/2008 | Ishizaka |
| 7,488,656 B2 | 2/2009 | Cartier |
| 7,556,998 B2 | 7/2009 | Park |
| 7,700,479 B2 | 4/2010 | Huang |
| 7,785,958 B2 | 8/2010 | Doczy |
| 2002/0127888 A1 | 9/2002 | Cho |
| 2005/0095763 A1 | 5/2005 | Samavedam |
| 2005/0202659 A1 | 9/2005 | Li |
| 2005/0275035 A1 | 12/2005 | Mathew |
| 2006/0024953 A1 | 2/2006 | Papa Rao |
| 2006/0040482 A1 | 2/2006 | Yang |
| 2006/0054943 A1 | 3/2006 | Li |
| 2007/0037335 A1 | 2/2007 | Chambers |
| 2007/0082445 A1 | 4/2007 | Yang |
| 2007/0138559 A1 | 6/2007 | Bohr |
| 2007/0145591 A1 | 6/2007 | Yano |
| 2007/0148838 A1 | 6/2007 | Doris |
| 2007/0210354 A1 | 9/2007 | Nabatame |
| 2007/0259519 A1 | 11/2007 | Yang |
| 2007/0262451 A1 | 11/2007 | Rachmady |
| 2007/0272123 A1 | 11/2007 | Kennedy |
| 2008/0076216 A1 | 3/2008 | Pae |
| 2008/0224235 A1 | 9/2008 | Lavoie |
| 2008/0318371 A1 | 12/2008 | Lin |
| 2009/0039433 A1 | 2/2009 | Yang |
| 2009/0057769 A1 | 3/2009 | Wei |
| 2009/0057787 A1 | 3/2009 | Matsuki |
| 2009/0166769 A1 | 7/2009 | Metz |
| 2009/0186458 A1 | 7/2009 | Yu |
| 2010/0044783 A1 | 2/2010 | Chuang |
| 2010/0052066 A1 | 3/2010 | Yu |
| 2010/0052074 A1 | 3/2010 | Lin |
| 2010/0065926 A1 | 3/2010 | Yeh |
| 2010/0068877 A1 | 3/2010 | Yeh |
| 2010/0081262 A1 | 4/2010 | Lim |
| 2010/0087055 A1 | 4/2010 | Lai |
| 2010/0124818 A1 | 5/2010 | Lee |
| 2010/0244141 A1 | 9/2010 | Beyer |

REPLACEMENT GATE PROCESS AND DEVICE MANUFACTURED USING THE SAME

BACKGROUND

1. Technical Field

The disclosure relates in general to a replacement gate process and device manufactured using the same, and more particularly to the replacement gate process capable of controlling a gate height of a device and the device manufactured using the same.

2. Description of the Related Art

Size of semiconductor device has been decreased for these years. Reduction of feature size, improvements of the rate, the efficiency, the density and the cost per integrated circuit unit are the important goals in the semiconductor technology. The electrical properties (such as junction leakage) of the device have to be maintained even improved with the decrease of the size, to meet the requirements of the commercial products in applications. The high k-metal gate (HKMG) technique has been developed, and the logic device with the HKMG structure offers quite a few advantages in terms of power reduction and performance improvements, particularly in the datapath and other high-speed areas.

The high k-metal gate (HKMG) process could be divided into two common process of gate-first and gate-last. Taken the gate-last HKMG process (also known as the replacement gate process) for example, a dummy gate is formed by material such as polysilicon or amorphous silicon, and the dummy gate is then removed and replaced by a metal gate. In another aspect, a high-K dielectric film is one of the important features in the semiconductor manufacturing of memory applications, which increases the capacity of the memory. In the HKMG process, the high-K dielectric film could be formed before manufacturing the dummy gate, which is a so-called high K first-HKMG process. The high-K dielectric film could be formed after the manufacture and removal of the dummy gate, which is a so-called high K last-HKMG process. No matter which process is adopted to pattern a HKMG stack, the gate height of the gate and topography of the stack should be precisely controlled for obtaining a semiconductor device with excellent electrical performance.

Figure 1A:
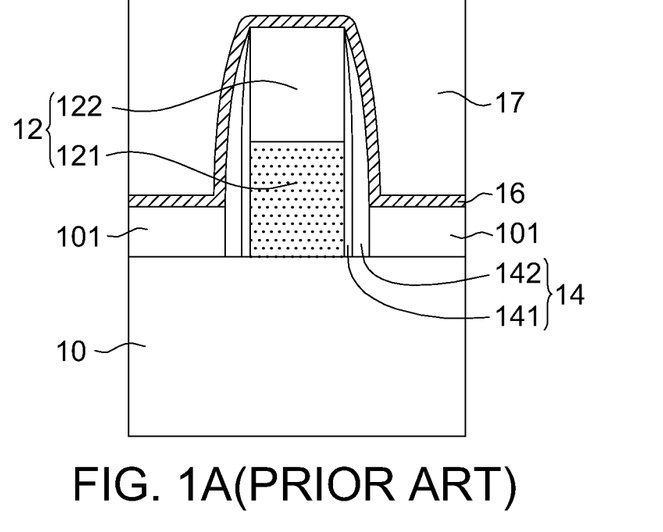
FIG. 1A~FIG. 1D illustrate a conventional high K-metal gate process.
Figure 1B:
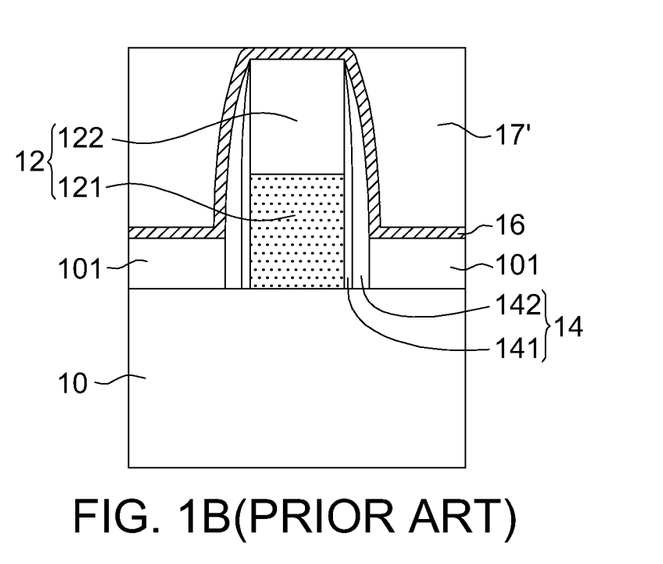
Figure 1C:
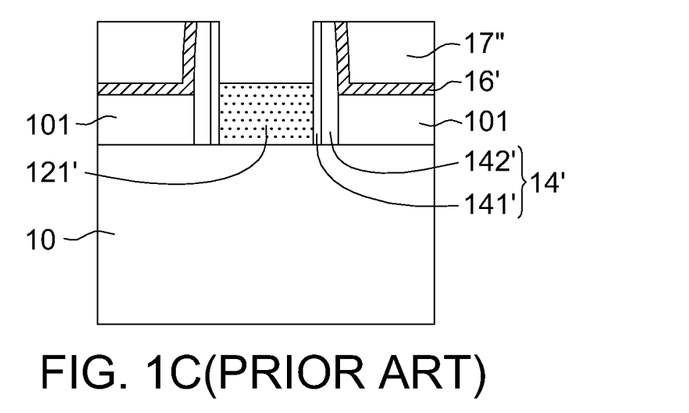
Figure 1D:
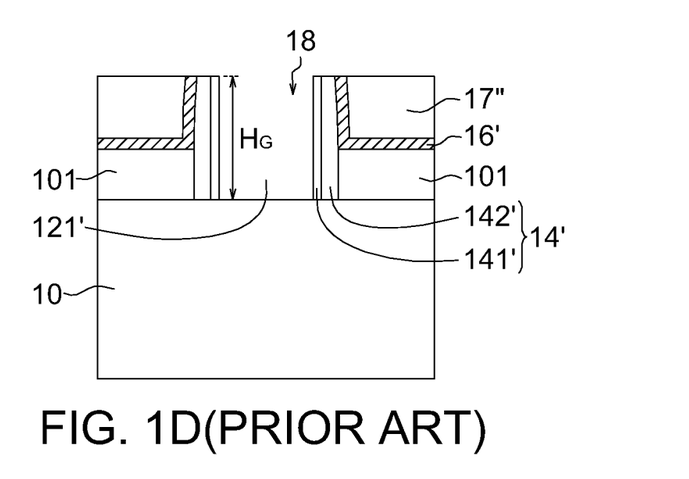

FIG. 1A~FIG. 1D illustrate a conventional high K-metal gate process. As shown in FIG. 1A, a substrate 10 with a dummy gate 12 is provided, and the dummy gate 12 includes a polysilicon layer 121 and a hard mask layer 122. Spacers 14 are formed on the sidewalls of the dummy gate 12, wherein the spacers 14 could be one layer, or multi-layer such as the first spacer 141 and the second spacer 142 depicted in FIG. 1A. Also, a contact etch stop layer 16 is formed on the substrate and covers the spacers 14, and an interlayer dielectric (ILD) layer 17 formed on the contact etch stop layer 16. An epitaxy layer 101 could be selectively grown on the substrate 10. As shown in FIG. 1B, the interlayer dielectric layer 17 is planarized by chemical mechanical polishing (CMP), and the upper surface of the contact etch stop layer 16 is exposed. As shown in FIG. 1C, the structure is then subjected to dry etching to remove parts of the interlayer dielectric layer 17, the contact etch stop layer 16 and the dummy gate 12, wherein the hard mask layer 122 is completely removed and the polysilicon layer 121 is partially removed. As shown in FIG. 1D, the remained polysilicon layer 121' is removed by wet etching to form a trench 18. A metal layer is filled in the trench 18, followed by planarization to form a metal gate (not depicted in Figures).

In the current HKMG process, the spacers (ex: the first spacer 141 and the second spacer 142) and the contact etch stop layer 16 are made of different materials. For example, the first spacer 141, the second spacer 142 and the contact etch stop layer 16 are oxide, nitride deposited by hollow cathode discharge (HCD), and nitride, respectively. Those materials are low etch resistance to the dry-etching or wet-etching removal of the dummy gate 12. In order to keep the final gate height $H_G$ of the structure, a higher dummy gate 12 is required to be constructed initially in this conventional process. In the 20 nm HKMG structure manufactured by the process of FIG. 1A~FIG. 1D, if the required final gate height $H_G$ of the structure is 1000 Å, the heights of the polysilicon layer 121 and the hard mask layer 122 (FIG. 1A) should be about 1000 Å, respectively. However, the higher dummy gate in the HKMG process would have undesired effect on the electrical performance of the device; for example, having impact on the ability of lightly doped drain (LDD) implantation.

SUMMARY

The disclosure is directed to a replacement gate process and device manufactured using the same, which is capable of controlling the gate height and topography, thereby improving the electrical performance of the device.

According to the disclosure, a replacement gate process is disclosed, comprising:

providing a substrate, and a dummy gate structure formed on the substrate, wherein the dummy gate structure comprises a dummy layer on the substrate, a hard mask layer on the dummy layer, spacers at two sides of the dummy layer and the hard mask layer, and a contact etch stop layer (CESL) covering the substrate, the spacers and the hard mask layer, wherein the spacers and the CESL are made of the same material;

removing a top portion of the CESL to expose the hard mask layer;

removing the hard mask layer; and removing the dummy layer to form a trench.

According to the disclosure, a semiconductor device is provided, comprising a substrate; spacers formed oppositely on the substrate and spaced apart to form a trench therebetween; a patterned CESL formed at outsides of the spacers and covering the substrate; wherein the spacers and the CESL are made of the same material.

DETAILED DESCRIPTION

The embodiment of the disclosure provides a replacement gate process and the device manufactured using the process of the embodiment, which is capable of controlling the gate height and topography of the device thereby improving the electrical performance. Due to the high etching selectivity to the materials and particular procedures of the embodiment, the lower height of the dummy gate could be constructed to achieve the same final gate height manufactured by the conventional process requiring the higher dummy gate.

The embodiments are described in details with reference to the accompanying drawings. The method of the disclosure could be applied to the high K-metal gate process to form a transistor structure, such as MOSFET (field-effect transistor) or the Fin FET. The similar elements of the embodiments are designated with similar reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. Moreover, the steps and elements in details of the embodiments could be modified or changed according to the actual needs of the practical applications. The disclosure is not limited to the descriptions of the embodiments.

FIG. 2A~FIG. 2E illustrate a high K-metal gate process (HKMG) according to the first embodiment of the present disclosure. In the first embodiment, the disclosure is applied to a high K last-HKMG process, which the high-K dielectric film is formed after the manufacture and removal of the dummy gate.

Figure 2A:
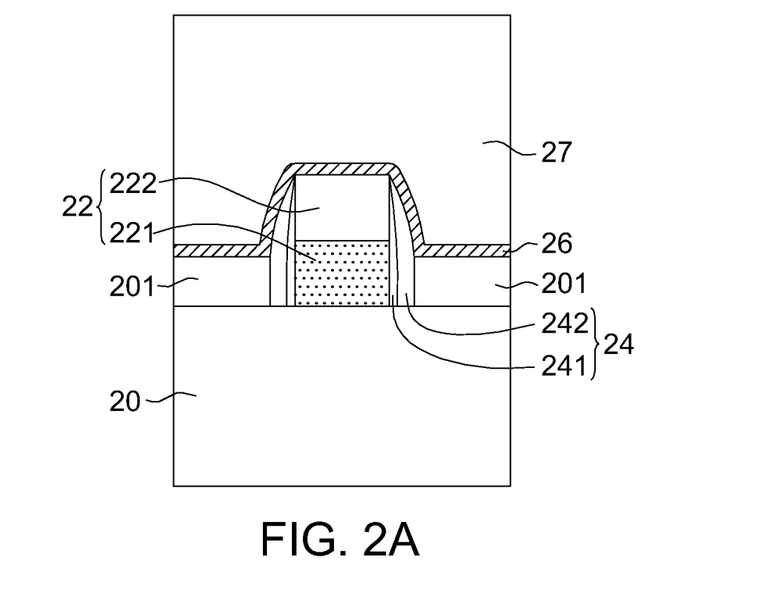
FIG. 2A~FIG. 2E illustrate a high K-metal gate process (HKMG) according to the first embodiment of the present disclosure.

As shown in FIG. 2A, a substrate 20 and a dummy gate structure formed on the substrate 20 are provided. The dummy gate structure comprises a dummy layer 221 formed on the substrate 20, a hard mask layer 222 formed on the dummy layer 221, spacers 24 formed at two sides of the dummy layer 221 and the hard mask layer 222, and a contact etch stop layer (CESL) 26 covering the substrate 20, the spacers 24 and the hard mask layer 222. The dummy layer 221 and the hard mask layer 222 constitute a dummy gate 22 of the device. Also, an epitaxy layer 201 could be selectively grown on the substrate 20. As shown in FIG. 2A, the contact etch stop layer 26 is formed on the epitaxy layer 201.

In the embodiment, the dummy gate structure further includes an interlayer dielectric (ILD) layer 27 formed on the contact etch stop layer 26. In the embodiment, the dummy layer 221 is a polysilicon layer, or an amorphous silicon layer. The spacers 24 could be one layer, or multi-layer such as the first spacer 241 and the second spacer 242 depicted in FIG. 2A.

Furthermore, the spacers 24 and the contact etch stop layer 26 of the embodiment are made of the same material, while the material of the hard mask layer 222 layer is different from that of the spacers 24 and the contact etch stop layer 26. In one embodiment, the spacers 24 (ex: the first spacer 241 and the second spacer 242) and the contact etch stop layer 26 are made of SICN, formed by atomic layer deposition (ALD). In one embodiment, the hard mask layer 222 is (but not limited to) made of nitrite or oxide; for example, the hard mask layer 222 is made of silicon nitrite (SIN).

Figure 2B:
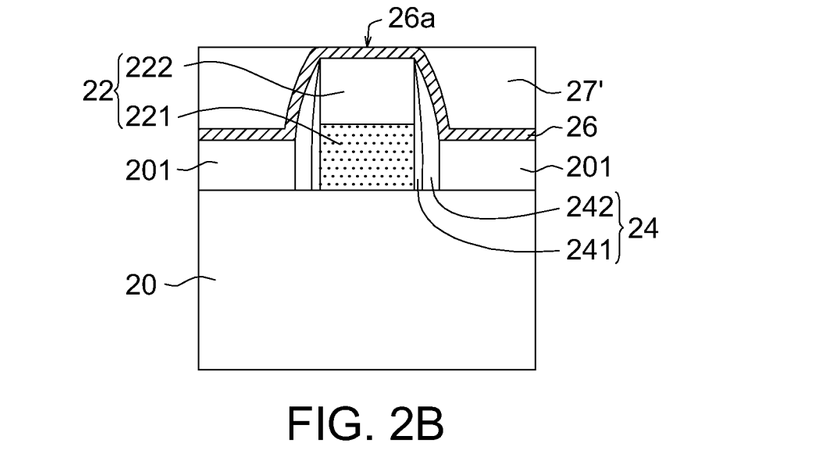

As shown in FIG. 2B, the interlayer dielectric layer 27 is planarized to expose an upper surface 26a of the contact etch stop layer 26. In one embodiment, the interlayer dielectric layer 27 could be made of oxide, and planarized by chemical mechanical polishing (CMP).

Figure 2C:
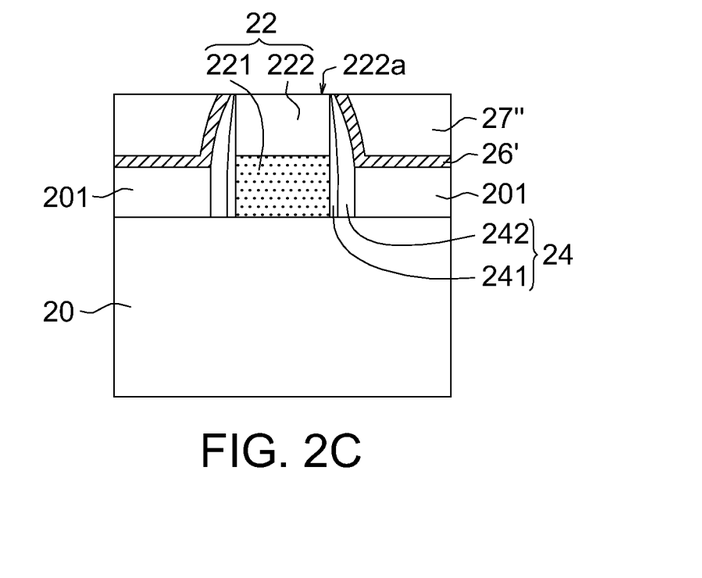

As shown in FIG. 2C, a top portion of the contact etch stop layer 26 is then removed to expose the surface 222a of the hard mask layer 222. In the embodiment, the top portion of the contact etch stop layer 26 could be removed by dry etching.

Figure 2D:
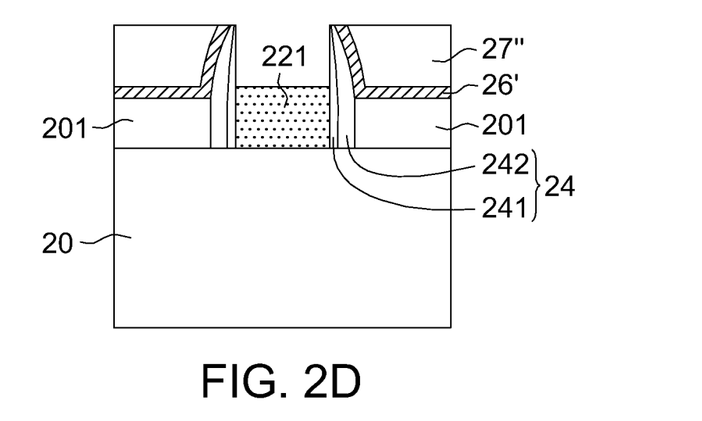

As shown in FIG. 2D, the hard mask layer 222 is removed. In the embodiment, the hard mask layer 222 could be completely removed by wet etching. In one embodiment, if the spacers 24 (ex: the first spacer 241 and the second spacer 242) and the contact etch stop layer 26 are made of ALD SICN while the hard mask layer 222 is made of nitrite, the hard mask layer 222 could be removed by a phosphate-based solution. Because of the high etching selectivity of the wet etching (ex: by the etching solution) to the materials of the hard mask layer 222 and the spacers 24/the contact etch stop layer 26, the spacers 24/the contact etch stop layer 26 are not damaged during the wet etching of the hard mask layer 222.

Figure 2E:
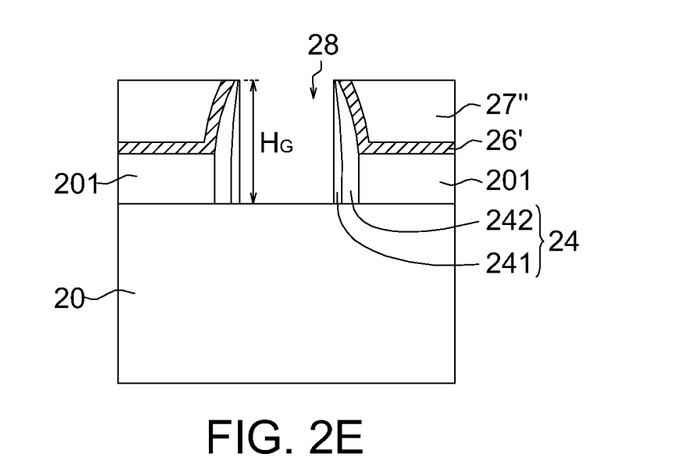

Afterward, the dummy layer 221 is removed to form a trench 28, as shown in FIG. 2E. In one embodiment, the dummy layer 221 could be removed by dry etching or wet etching.

The process of the first embodiment is applied to a high K last-HKMG structure. After steps illustrated in FIG. 2A~FIG. 2E, a high K dielectric layer could be formed in the trench 28, followed by the fabrication of metal gate in the trench 28. In an application, an interfacial layer (IL) could be selectively formed on the substrate within the trench 28, and a high K dielectric layer could be formed on the sidewalls of the trench 28 and on the interfacial layer. The interfacial layer isolates the high K dielectric layer from the silicon substrate 20. Next, a metal layer is filled in the trench 28, followed by planarization (ex: by CMP) to form a metal gate (not depicted in Figures), and complete the replacement of dummy gate with metal gate.

In the embodiment, material examples of the interfacial layer include, but are not limited to, oxides. Material examples of the high-k gate dielectric layer include, but are not limited to, hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate and other suitable materials. Materials of the metal gate could be, but are not limited to, the work function metals suitable for adjusting the work functions of N/P-type transistors, and the metals with low resistance. Examples of the work function metals include TiN, TaN, titanium carbide (TiC), tantalum carbide (TaC), tungsten carbide (WC), or aluminum titanium nitride (TiAlN), titanium aluminide (TiAl), zirconium aluminide (ZrAl), tungsten aluminide (WAl), tantalum aluminide (TaAl), or hafnium aluminide (HfAl). Examples of the metals with low resistance include Al, Cu and other suitable materials.

Figure 3:
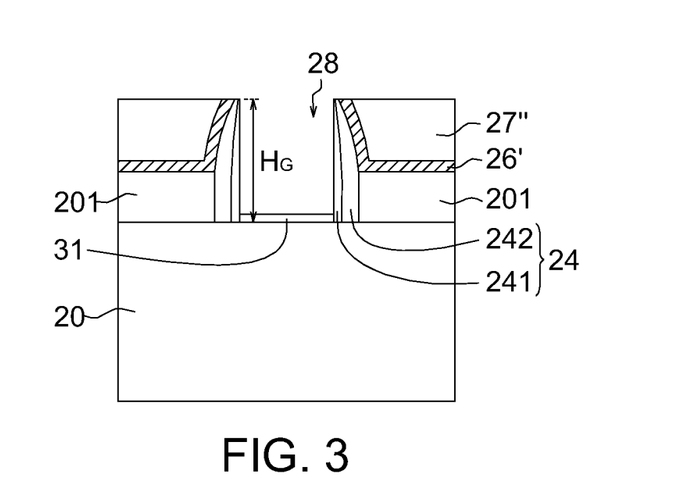
FIG. 3 illustrates a semiconductor device having a high K first-HKMG structure manufactured by the method of the second embodiment of the present disclosure, which a dummy gate has been removed.

The disclosure could be applied to a high K first-HKMG structure, and the method of the application is similar to the procedures illustrated in FIG. 2A~FIG. 2E, except the formation of a gate dielectric layer between the substrate 20 and the dummy layer 221. FIG. 3 illustrates a semiconductor device having a high K first-HKMG structure manufactured by the method of the second embodiment of the present disclosure, which a dummy gate has been removed. Please refer to FIG. 2A~FIG. 2E and FIG. 3. In the second embodiment, a gate dielectric layer 31 is formed on the substrate 20, and a dummy gate is then formed on the gate dielectric layer 31 (i.e. high K first). The trench 28 with the gate dielectric layer 31 formed thereon is formed by removing the dummy gate. In practical application, the gate dielectric layer 31 could be a single layer such as a high-K dielectric layer, or a multi-layer comprising an interfacial layer (such as an oxide layer or a layer made of materials described above) and the high-K dielectric layer formed on the interfacial layer. The disclosure is not limited thereto. Subsequently, metal layer is filled in the trench 28, followed by planarization (ex: by CMP) to form a metal gate in the trench 28, and the replacement of dummy gate with metal gate is completed.

Figure 4:
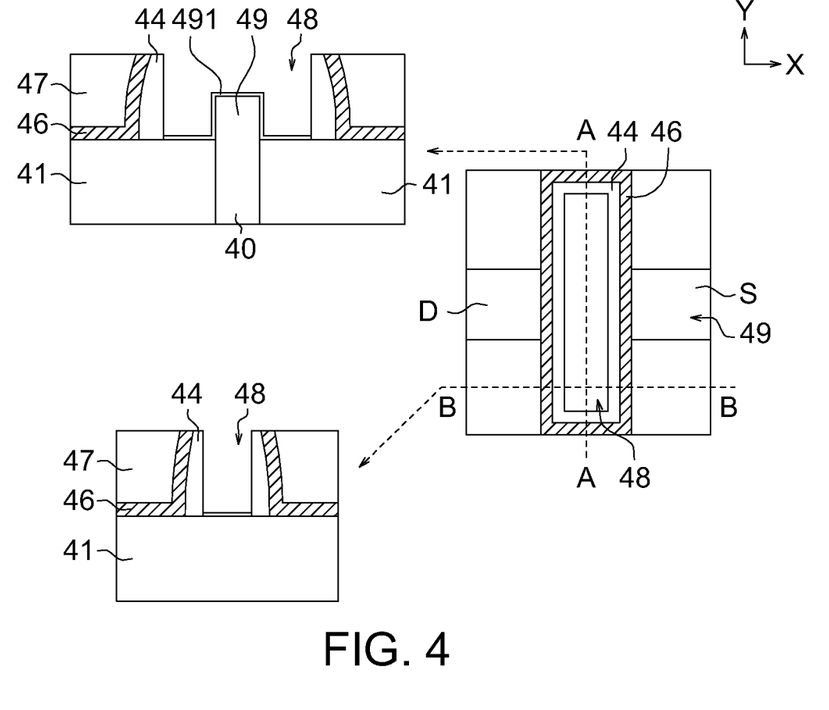
FIG. 4 illustrates a Fin-FET structure manufactured by the method of the third embodiment of the present disclosure, which a dummy gate has been removed.

The disclosure could be applied to a fin field electric transistor (Fin-FET), and the method of the application is similar to the procedures illustrated in FIG. 2A~FIG. 2E. FIG. 4 illustrates a Fin-FET structure manufactured by the method of the third embodiment of the present disclosure, which a dummy gate has been removed. Please refer to FIG. 2A~FIG. 2E and FIG. 4. In the third embodiment, a fin channel 49 (such as a silicon fin) is formed on the substrate, wherein the substrate has structure of shallow trench isolation 41. An extending direction of the fin channel 49 (ex: parallel to x-direction) is perpendicular to an extending direction of the trench 48 (ex: parallel to y-direction). Also, a blanket of a dielectric layer 491 is formed on the fin channel 49 and the substrate. The dummy gate structure is formed on the fin channel 49 and the substrate by exposing a portion of the fin channel 49, and source S and drain D are separately formed on two oppositely sides of the exposed portion of the fin channel 49 adjacent to the dummy gate structure. As shown in FIG. 4, the source S and the drain D are positioned outside and adjacent to the spacers 47. Please also refer to FIG. 2A-FIG. 2E. In the third embodiment, a dummy gate structure (including the dummy layer, the hard mask layer, the spacers 44, the contact etch stop layer 46 and the ILD 47) is formed on the substrate having the fin channel 49, and the trench 48 is formed after removing the dummy gate by high dry/wet etching selectivity. Subsequently, metal layer is filled in the trench 48, followed by planarization (ex: by CMP) to form a metal gate in the trench 48, and the replacement of dummy gate with metal gate is completed. The metal gate straddles on three sidewalls of the fin channel 49, thereby forming a fin-FET with gate on the three dimensional (3D) fin structure. Since the channel between source S and drain D is covered by the gate, three surfaces could be utilized to provide more current paths.

According to the aforementioned descriptions, a lower height of the dummy gate could be constructed by adopting the methods of the embodiments to achieve the same final gate height manufactured by the conventional process requiring the higher dummy gate. Decrease of gate height would reduce the considerable effect of ion implantation process on the electrical performance of the device. For example, the shadow effect induced by (lightly doped drain LDD) implantation is reduced. Please compare FIG. 2A to FIG. 1A, and FIG. 2E to FIG. 1D. In the conventional 20 nm HKMG process, if the required final gate height $H_G$ of the structure is 1000 Å, the heights of the polysilicon layer 121 and the hard mask layer 122 (FIG. 1A) should be respectively about 1000 Å; however, the structure manufactured by the method of the embodiment merely requires about 500 Å of the dummy layer 221 and about 500 Å of the hard mask layer 222. In one embodiment, the thickness/height of the dummy layer 221 is in a range of 400 Å to 1200 Å, but the disclosure is not limited to those values. In practical application, the thickness/height of the dummy layer 221 is determined according to the required gate height of the device. By applying the method of the embodiment, the spacers 24/the contact etch stop layer 26 would not be damaged during the wet etching of the hard mask layer 222 due to the high etching selectivity of the dry/wet etching, thereby keeping the topography of the device and improving the electrical performance.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A replacement gate process, comprising:
providing a substrate, and a dummy gate structure formed on the substrate, wherein the dummy gate structure comprises a dummy layer on the substrate, a hard mask layer on the dummy layer, spacers at two sides of the dummy layer and the hard mask layer, a contact etch stop layer (CESL) covering the substrate, the spacers and the hard mask layer, and an interlayer dielectric layer covering the CESL, wherein the spacers and the CESL are made of the same material;
planarizing the interlayer dielectric (ILD) layer to expose a top surface of the CESL and form a patterned ILD layer, wherein the top surface of the CESL covering the hard mask layer is aligned with a top surface of the patterned ILD layer;
dry etching the CESL for removing a top portion of the CESL by stopping at a top surface of the hard mask layer to expose the hard mask layer;
removing the hard mask layer; and
removing the dummy layer to form a trench.

2. The replacement gate process according to claim 1, wherein material of the HM layer is different from that of the spacers and the CESL.

3. The replacement gate process according to claim 1, wherein the dummy layer is a polysilicon layer, or amorphous silicon layer.

4. The replacement gate process according to claim 1, wherein the spacers and the CESL are made of SICN, which is formed by atomic layer deposition (ALD).

5. The replacement gate process according to claim 1, wherein the hard mask layer is made of nitrite or oxide.

6. The replacement gate process according to claim 5, wherein the hard mask layer is made of SIN.

7. The replacement gate process according to claim 1, wherein the hard mask layer is removed by wet etching.

8. The replacement gate process according to claim 1, wherein the dummy gate structure further comprises a gate dielectric layer between the substrate and the dummy layer.

9. The replacement gate process according to claim 8, wherein the gate dielectric layer is a high-K dielectric layer, or a multi-layer comprising an oxide layer and the high-K dielectric layer formed on the oxide layer.

10. The replacement gate process according to claim 1, further comprising forming a gate dielectric layer in the trench.

11. The replacement gate process according to claim 1, further comprising forming a metal gate in the trench.

12. The replacement gate process according to claim 1, wherein a fin channel is formed on the substrate, and the dummy gate structure is formed on the fin channel and the substrate by exposing a portion of the fin channel, and a source and a drain are separately formed on two oppositely sides of the exposed portion of the fin channel adjacent to the dummy gate structure.

13. The replacement gate process according to claim 1, wherein a thickness of the dummy layer is in a range of 400 Å to 1200 Å.

* * * * *